United States Patent
Hosono et al.

(10) Patent No.: US 8,829,951 B2
(45) Date of Patent: Sep. 9, 2014

(54) DRIVE CIRCUIT FOR SWITCHING ELEMENT

(71) Applicant: Denso Corporation, Kariya (JP)

(72) Inventors: Yukio Hosono, Kakamigahara (JP); Takeyasu Komatsu, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 14/035,335

(22) Filed: Sep. 24, 2013

(65) Prior Publication Data

US 2014/0084967 A1     Mar. 27, 2014

(30) Foreign Application Priority Data

Sep. 24, 2012 (JP) .................................. 2012-209855

(51) Int. Cl.
*H03K 3/00*     (2006.01)
*H03K 17/00*     (2006.01)

(52) U.S. Cl.
CPC ...................................... *H03K 17/00* (2013.01)
USPC .......................................................... 327/109

(58) Field of Classification Search
USPC .......................................................... 327/109
See application file for complete search history.

(56) References Cited

U.S. PATENT DOCUMENTS 5,625,312 A    4/1997   Kawakami et al.
8,704,556 B2 *   4/2014   Hamanaka et al. ........... 327/109

FOREIGN PATENT DOCUMENTS

JP        08-018423     1/1996
JP        2012-016110     1/2012

* cited by examiner

*Primary Examiner* — Daniel Rojas
(74) *Attorney, Agent, or Firm* — Nixon & Vanderhye PC

(57) ABSTRACT

A drive circuit is provided for a target switching element and opens/closes a current path by controlling an absolute value of a potential difference between one end of the current path and an opening/closing control terminal. The drive circuit includes an integrated circuit connected to the control terminal. The integrated circuit includes an absolute value control circuit controlling the absolute value of the potential difference when the switching element is in an off-state, a stabilization circuit stabilizing the potential difference at a value for maintaining the switching element in an off-state when the switching element is in an off-state, a selection circuit selecting one of control of the absolute value of the potential difference by the control circuit and stabilization of the potential difference by the stabilization circuit, and an on-state terminal connected to the control circuit and the control terminal. The on-state terminal is connected to the stabilization circuit.

8 Claims, 5 Drawing Sheets

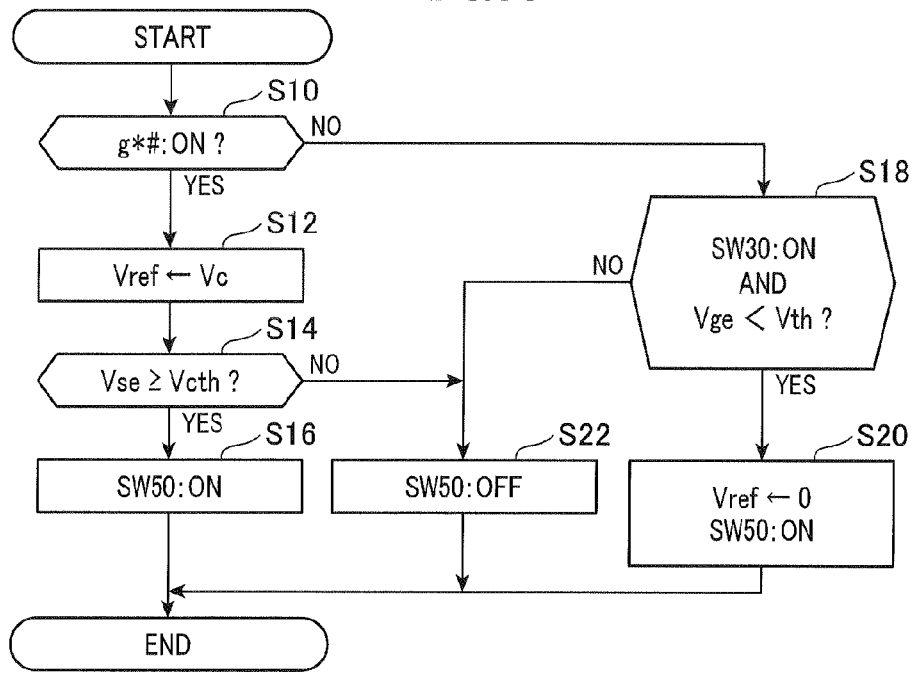
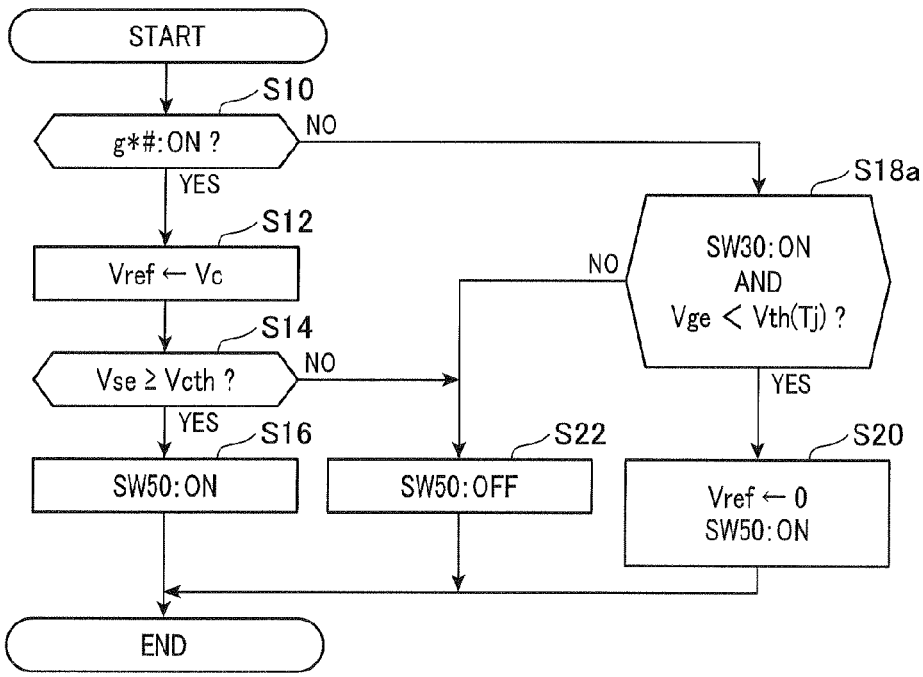

DRIVE CIRCUIT FOR SWITCHING ELEMENT

CROSS-REFERENCE TO RELATED APPLICATION

This application is based on and claims the benefit of priority from earlier Japanese Patent Application No. 2012-209855 filed Sep. 24, 2012, the description of which is incorporated herein by reference.

BACKGROUND

1. Technical Field

The present invention relates to a drive circuit for a switching element which is a target to be driven (hereinafter, referred to as "target switching element"). The target switching element is a voltage control type switching element. The drive circuit includes an integrated circuit. The target switching element opens and closes a current path by electronically controlling an absolute value of a potential difference between a reference end which is one end of the current path and an opening and closing control terminal.

2. Related Art

For example, JP-A-2012-16110 discloses a configuration in which IGBTs (Insulated gate bipolar transistors) configuring an inverter for an in-vehicle traction unit are used as target switching elements, and a drive circuit driving the target switching elements includes an integrated circuit. According to this technique, a controller generating operation signals for the IGBTs outputs the operation signals to the integrated circuit via a photocoupler.

Meanwhile, incorporating a photocoupler and the like into an integrated circuit can manufacture the whole control system in smaller size compared with externally attaching the photocoupler and the like to the integrated circuit. If an insulation communication means such as a photocoupler is incorporated into an integrated circuit, it is required that a high-voltage side area, which is connected to a gate of an IGBT in the integrated circuit, and a low-voltage side area, into which operation signals are inputted, are insulated from each other in the integrated circuit. In this case, the number of terminals required to be connected to the high-voltage side area tends to be larger than the number of terminals required to be connected to the low-voltage side area. Hence, disadvantages are found when the insulation communication means is incorporated into an integrated circuit. For example, the integrated circuit is redundantly designed.

SUMMARY

As an aspect of an embodiment, a drive circuit is provided for a switching element which is a target to be driven and which opens and closes a current path by electronically controlling an absolute value of a potential difference between a reference end which is one end of the current path and an opening and closing control terminal. The drive circuit includes an integrated circuit which is connected to the opening and closing control terminal. The integrated circuit includes an absolute value control circuit which controls the absolute value of the potential difference when the switching element is in an off state; a stabilization circuit which stabilizes the potential difference at a value for maintaining the switching element in an off state when the switching element is in an off state; a selection circuit which selects one of control of the absolute value of the potential difference by the absolute value control circuit and stabilization of the potential difference by the stabilization circuit; and an on-state terminal which is connected to the absolute value control circuit and the opening and closing control terminal. The on-state terminal is connected to the stabilization circuit.

BRIEF DESCRIPTION OF THE DRAWINGS

In the accompanying drawings:

FIG. 3 is a flow diagram showing a procedure of a selection process according to the first embodiment;

FIG. 4 is a flow diagram showing a procedure of a selection process according to a second embodiment;

DETAILED DESCRIPTION OF THE PREFERRED EMBODIMENTS (First Embodiment)

Hereinafter, the first embodiment will be described in which a drive circuit for a target switching element is applied to a power converter circuit connected to an in-vehicle traction unit.

Figure 1:
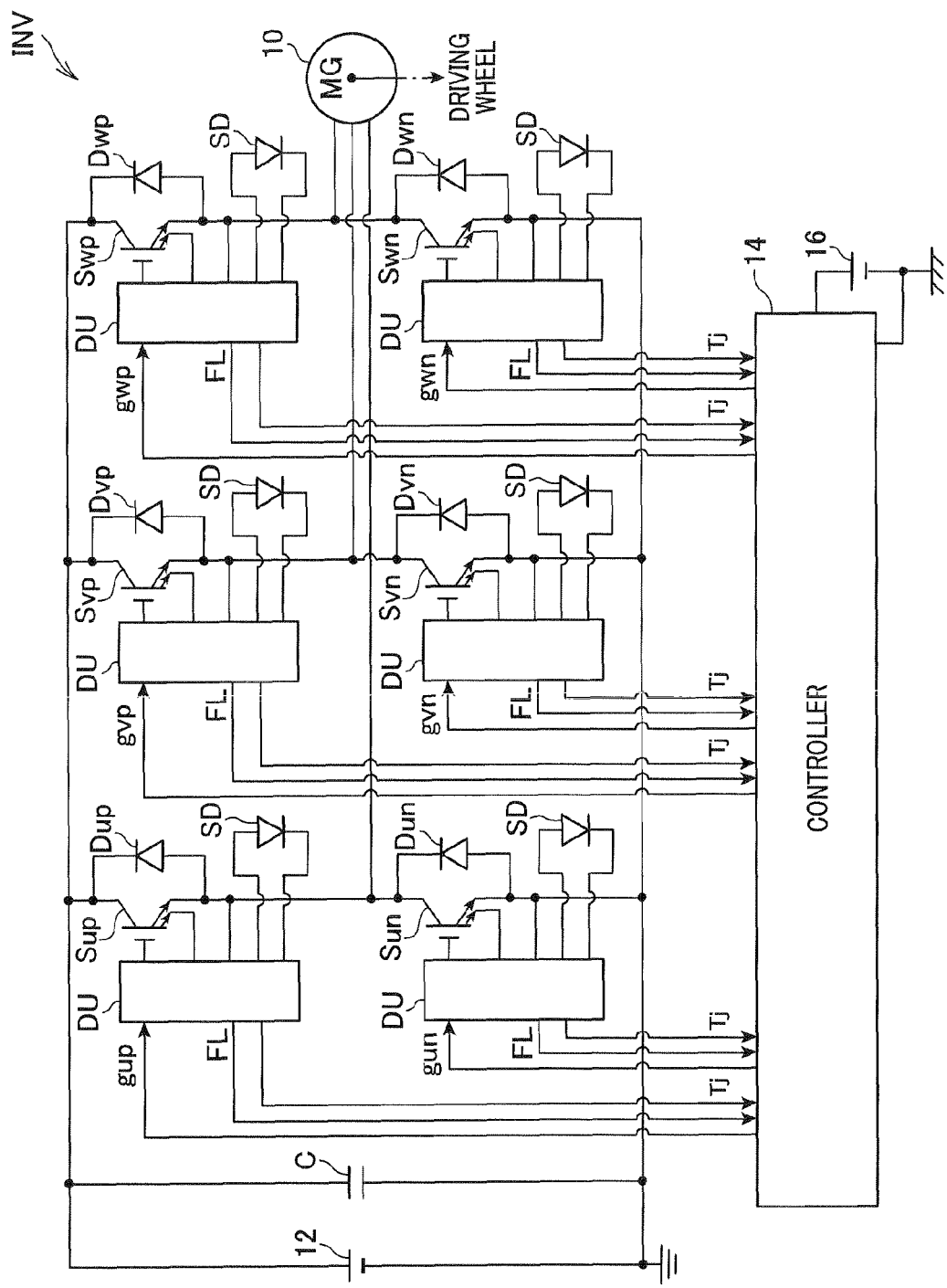
FIG. 1 is a diagram showing a system configuration according to a first embodiment.

FIG. 1 shows the overall configuration of a control system according to the present embodiment. A motor generator 10 is an in-vehicle traction unit which is mechanically connected to drive wheels, which are not shown. The motor generator 10 is connected to a high-voltage battery 12 via an inverter INV. The inverter INV includes a series connection of switching elements Sup and Sun, a series connection of switching elements Svp and Svn, and a series connection of switching elements Swp and Swn. Connecting points of these series connections are connected to respective phases, that is, U phase, V phase, and W phase of the motor generator 10. As the switching elements S*# (*=u, v, w; #=p, n), insulated gate bipolar transistors (IGBTs) are used. Diodes D*# are connected to the respective switching elements S*# in anti-parallel.

A controller 14 uses a low-voltage battery 16 as a power supply. The controller 14 controls the motor generator 10. The controller 14 operates the inverter INV so that controlled variables of the motor generator 10 are desirably controlled. Specifically, the controller 14 outputs operation signals g*# to drive units DU to operate the switching elements S*# of the inverter INV. Note that high-potential side operation signals g*p and low-potential side operation signals g*n, which correspond to the high-potential side operation signals g*p, are complementary to each other. In other words, the high-potential side switching elements S*p and the corresponding low-potential side switching elements S*n are alternately turned on.

Figure 2:
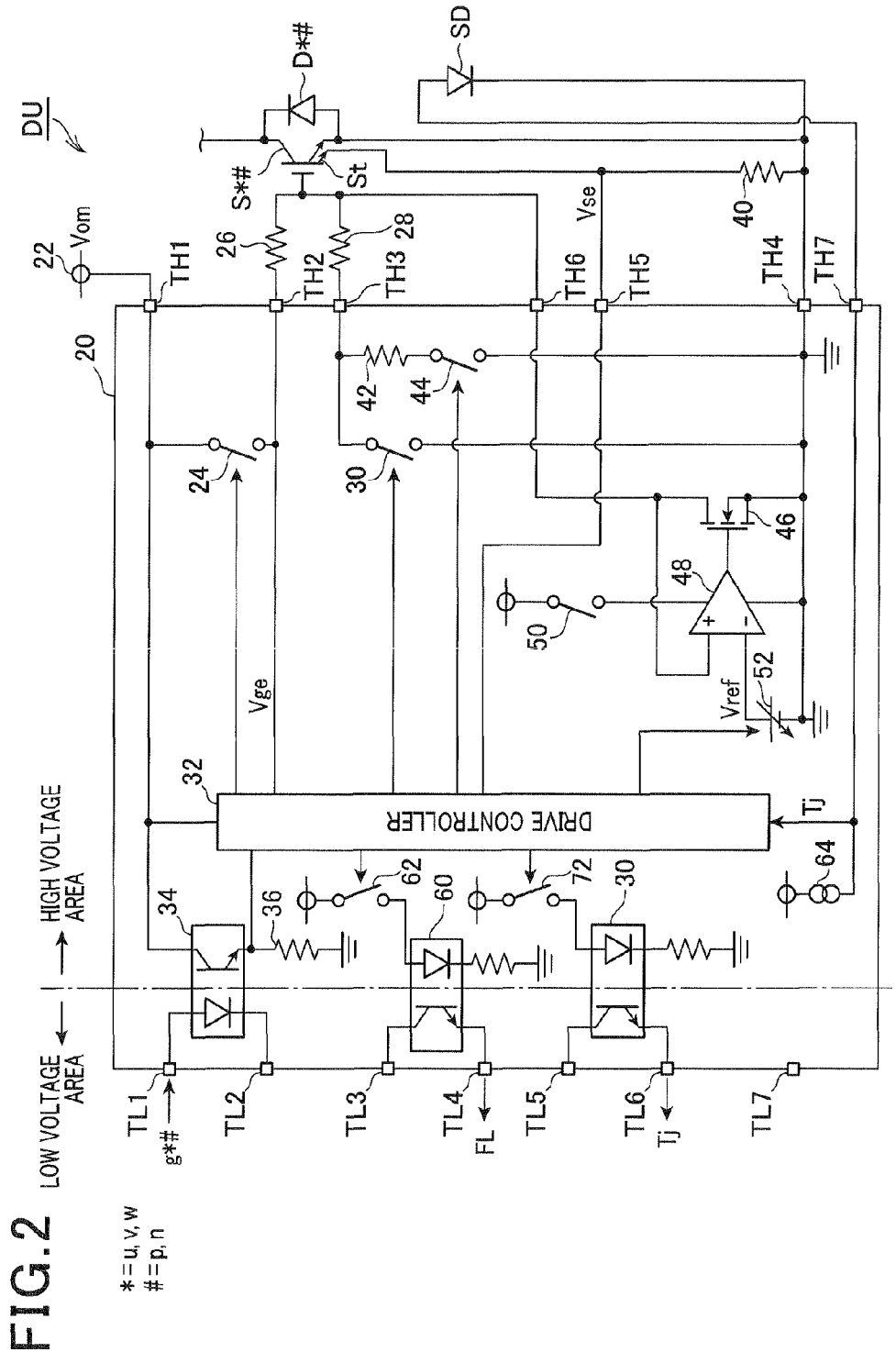
FIG. 2 is a circuit diagram showing a configuration of a drive unit according to the first embodiment.

FIG. 2 shows the configuration of the drive unit DU.

As shown in FIG. 2, the drive unit DU includes a drive IC 20, which is a one-chip semiconductor integrated circuit. The drive IC 20 includes a DC voltage source 22 having a terminal voltage Vom. A terminal of the DC voltage source 22 is connected to an opening and closing control terminal (gate) of the switching element S*# via a high-voltage side terminal TH1, a charging switching element 24, a high-voltage side terminal TH2, and a charging resistor 26.

The gate of the switching element S*# is connected to a high-voltage side terminal TH4 via a discharging resistor 28, a high-voltage side terminal TH3, and a discharging switching element 30. The high-voltage side terminal TH4 is connected to a reference end (emitter), which is one end of a current path of the switching element S*# (between the emitter and a collector).

The charging switching element 24 and the discharging switching element 30 are operated by a drive controller 32 of the drive IC 20. That is, the drive controller 32 drives the switching element S*# by alternately turning on and off the charging switching element 24 and the discharging switching element 30 on the basis of the operation signal g*#. Specifically, if the operation signal g*# serves as an on-operation command, the drive controller 32 turns off the discharging switching element 30 and turns on the charging switching element 24. Meanwhile, if the operation signal g*# serves as an off-operation command, the drive controller 32 turns off the charging switching element 24 and turns on the discharging switching element 30.

The operation signal g*# outputted from the controller 14 shown in FIG. 1 is received by the drive controller 32 via a photocoupler 34. This is because a high-voltage system including the high-voltage battery 12 is insulated from a low-voltage system including the controller 14. Hence, the drive IC 20 includes a low-voltage side area configuring the low-voltage system and a high-voltage side area configuring the high-voltage system. The photocoupler 34 serving as an insulation communication means is used to transmit the operation signal g*# from the low-voltage side area to the high-voltage side area while insulating the two areas from each other. In the photocoupler 34, low-voltage side terminals TL1, TL2 are respectively connected to an anode and a cathode of a photodiode which is the primary side of the photocoupler 34. A collector of a phototransistor, which is the secondary side of the photocoupler 34, is connected to the DC voltage source 22. An emitter of the phototransistor is connected to an emitter of the switching element S*# via a resistor 36. According to this configuration, the amount of voltage drop of the sense resistor 36 can be received by the drive controller 32 as a logic signal according to the operation signals g*#.

The high-voltage side terminal TH3 is connected to the high-voltage side terminal TH4 via a soft breaking resistor 42 and a soft breaking switching element 44.

In addition, the gate of the switching element S*# is connected to a high-voltage side terminal TH6. The high-voltage side terminal TH6 is connected to the high-voltage side terminal TH4 via an N-channel metal-oxide semiconductor field-effect transistor (MOSFET) (clamping switching element 46). An output voltage of an operational amplifier 48 is applied to a gate of the clamping switching element 46. A reference voltage Vref of a power source 52 is applied to an inverting input terminal of the operational amplifier 48. A gate voltage Vge of the switching element S*# is applied to a non-inverting input terminal of the operational amplifier 48 via the high-voltage side terminal TH6. Power supply for the operational amplifier 48 from the DC voltage source 22 is started or stopped by a power supply switching element 50.

The switching element S*# includes a sense terminal St which outputs a minute current having correlation to a current (collector current) flowing through a current path of the switching element S*# (between the collector and the emitter). The sense terminal St is electrically connected to the emitter via a sense resistor 40. Hence, since voltage drop is caused in the sense resistor 40 due to the current outputted from the sense terminal St, the amount of voltage drop of the sense resistor 40 (sense voltage Vse) can be assumed to be an electric quantity of state having correlation to a current flowing through the current path of the switching element S*#.

The sense voltage Vse is received by the drive controller 32 via a high-voltage side terminal TH5. The drive controller 32 operates the power supply switching element 50 and the soft breaking switching element 44 on condition that it is determined on the basis of the sense voltage Vse that an abnormal current will flow to the switching element S*#. The soft breaking switching element 44 is used for decreasing surge voltage when forcibly changing the switching element S*# to an off state. This is because an impedance of a discharge path of the gate of the switching element S*# obtained when the soft breaking switching element 44 is turned on is higher than an impedance of a discharge path obtained when the discharging switching element 30 is turned on, due to the soft breaking resistor 42. Hence, when the soft breaking switching element 44 is turned on, the switching element S*# can be changed to an off state while the speed of changing the switching state is lower than that obtained when the discharging switching element 30 is turned on.

In addition, on condition that it is determined on the basis of the sense voltage Vse that an abnormal current will flow to the switching element S*#, the drive controller 32 outputs a fail signal FL to the controller 14 via a photocoupler 60. An anode of the primary side (photodiode) of the photocoupler 60 is connected to the DC voltage source 22 via a switching element 62. A cathode of the primary side (photodiode) of the photocoupler 60 is connected to an emitter of the switching element S*# via a resistor. In addition, a collector and an emitter of the secondary side (phototransistor) of the photocoupler 60 are respectively connected to low-voltage side terminals TL3, TL4, which can output a fail signal FL to the controller 14.

The drive IC 20 has a function for outputting a temperature Tj of the switching element S*#, in addition to the fail signal FL, to the controller 14. That is, a temperature-sensitive diode SD sensing the temperature of the switching element S*# is provided in the vicinity of the switching element S*#. A cathode of the temperature-sensitive diode SD is at the same potential as that of the emitter of the switching element S*# via the high-voltage side terminal TH4. In contrast, an anode of the temperature-sensitive diode SD is connected to a constant current source 64 via a high-voltage side terminal TH7. The drive controller 32 receives the amount of voltage drop in the forward direction of the temperature-sensitive diode SD as a detection signal of the temperature Tj of the switching element S*#. This considers that one-to-one relationship is established between the amount of voltage drop and the temperature when the current flowing to the temperature-sensitive diode SD is constant. The drive controller 32 converts, in a binary signal consisting of logic H and logic L, the amount of voltage drop to a time ratio of logic H with respect to one period of the binary signal, and outputs the binary signal to the controller 14 via a photocoupler 70. An anode of the primary side (photodiode) of the photocoupler 70 is connected to the DC voltage source 22 via a switching element 72. A cathode of the primary side (photodiode) of the photocoupler 70 is connected to an emitter of the switching element S*# via a resistor. In addition, a collector and an emitter of the secondary side (phototransistor) of the photocoupler 70 are respectively connected to low-voltage side terminals TL5, TL6, which can output information on the temperature Tj represented by a time ratio to the controller 14.

Meanwhile, communication lines connecting between the low-voltage side area of the drive IC 20 and the controller 14 are limited to a transmission path for the operation signal g*# and transmission paths for the fail signal FL and the temperature Tj. In contrast, the number of electric paths connecting between the high-voltage side area of the drive IC 20 and external components tends to be larger. If the number of high-voltage side terminals THi (i=1, 2, 3, . . . ) is larger than the number of low-voltage side terminals TLi (i=1, 2, 3, . . . ), the drive IC 20 can be redundant. Furthermore, the drive IC 20 can increase in size. This is because the high-voltage side terminal THi and the low-voltage side terminal TLi are required to be insulated from each other, which makes it difficult to provide the high-voltage side terminal THi and the low-voltage side terminal TLi on the same side. Hence, it is desirable to decrease the difference between the number of high-voltage side terminals THi and the number of low-voltage side terminals TLi to restrain redundancy of the drive IC 20 so as to miniaturize the drive IC 20 as much as possible.

In the present embodiment, the high-voltage side terminal TH6 is shared between a circuit used when the switching element S*# is in an on state and a circuit used when the switching element S*# is in an off state. This will be described below with reference to FIG. 3.

FIG. 3 shows a procedure of one selection process included in a plurality of processes performed by using the high-voltage side terminal TH6. This process is performed by the drive controller 32. Note that the high-voltage side terminal TH6 configures an on-state terminal.

First, in step S10, the drive controller 32 determines whether or not an operation signal g*# is an on-operation command. If the operation signal g*# is an on-operation command, in step S12, the drive controller 32 sets a clamping voltage Vc to a reference voltage Vref generated by the power source 52 shown in FIG. 2. Note that the clamping voltage Vc is lower than a terminal voltage Vom of the DC voltage source 22 and higher than a threshold voltage Vth for changing the switching element S*# to an on state.

Next, in step S14, the drive controller 32 determines whether or not the sense voltage Vse is equal to or more than a clamping threshold voltage Vcth. This process is for determining whether or not an excessive current is flowing to the switching element S*#. Note that the clamping threshold voltage Vcth is set aiming to detecting a short-circuit current flowing to the switching element S*p of an upper arm and the switching element S*n of a lower arm when both the switching element S*p and the switching element S*n are turned on.

In step S14, if a positive determination is made, in step S16, the drive controller 32 turns on the power supply switching element 50. Thereby, a gate voltage of the clamping switching element 46 is controlled by the operational amplifier 48 by controlling impedance of the current path of the clamping switching element 46 (between the source and the drain) so that a voltage of the high-voltage side terminal TH6 (gate voltage Vge) becomes the clamping voltage Vc. However, if the gate voltage Vge is lower than the clamping voltage Vc, the clamping voltage Vc cannot be set to the gate voltage Vge by controlling the impedance. Hence, in practice, the control of the impedance is a guard process for making the gate voltage Vge equal to or less than the clamping voltage Vc. Note that, in this process, the clamping switching element 46, the operational amplifier 48, the power supply switching element 50 and the power source 52 configure a guard process circuit, and the operational amplifier 48 configures impedance control means.

In contrast, if a negative determination is made in step S10, in step S18, the drive controller 32 determines whether or not the discharging switching element 30 has turned on and the gate voltage Vge is smaller than the threshold voltage Vth. This process is for determining whether a process is performed or not which stabilizes the gate voltage Vge at a value required for fixing the switching element S*# to an off state. If a positive determination is made in step S18, in step S20, the drive controller 32 sets the reference voltage Vref to zero and turns on the power supply switching element 50. Hence, if the gate voltage Vge increases so as to exceed zero, impedance of the current path of the clamping switching element 46 decreases, which prevents the gate voltage Vge from increasing. Note that, in this process, the clamping switching element 46, the operational amplifier 48, the power supply switching element 50 and the power source 52 configure a stabilization circuit.

If a negative determination is made in step S14 or S18, in step S22, the drive controller 32 turns off the power supply switching element 50. If the process in step S16, S20 or S22 is completed, the whole process is ended.

According to the above embodiment, the following advantages can be obtained.

(1) The high-voltage side terminal TH6 is shared between the stabilization circuit, which stabilizes the gate voltage Vge at a value for maintaining the switching element S*# in an off state when the switching element S*# is in an off state, and a circuit which performs a guard process for the gate voltage Vge with the clamping voltage Vc when an excessive current flows to the switching element S*#. Hence, the drive IC 20 can be miniaturized as much as possible.

(2) The guard process circuit, which performs a guard process for the gate voltage Vge with the clamping voltage Vc, shares the high-voltage side terminal TH6 with the stabilization circuit. The path between the high-voltage side terminal TH6 connected to the guard process circuit and the gate of the switching element S*# is required to have low impedance from the viewpoint of maintaining controlling the gate voltage Vge to the clamping voltage Vc by the guard process circuit. Meanwhile, impedance of the path between the gate of the switching element S*# and the stabilization circuit is also required to be low. Hence, by sharing the high-voltage side terminal TH6 between two circuits which are desired to have low impedance between the two circuits and the gate of the switching element S*#, interfering with functions of the circuits due to the sharing can be preferably avoided.

(3) Configuring the stabilization circuit and the guard process circuit with a circuit, which controls the gate voltage Vge by controlling impedance of a current path of the gate of the clamping switching element 46 by electronically controlling the gate of the clamping switching element 46, can share the components between the stabilization circuit and the guard process circuit.

(4) The stabilization process for the gate voltage Vge is performed by the stabilization circuit by receiving a detection value of the gate voltage Vge. Hence, when the stabilization process is desired in a state where the switching element S*# is actually turned off, the stabilization process can be reliably performed.

(5) The drive IC 20 includes the high-voltage side area and the low-voltage side area which are insulated from each other. In this case, imbalance between the number of the high-voltage side terminals THi and the number of the low-voltage side terminals TLi leads to redundancy and increase in size of the drive IC 20. Hence, advantages obtained by sharing the high-voltage side terminal THi are especially significant.

(Second Embodiment)

Hereinafter, the second embodiment will be described focusing on differences from the first embodiment with reference to drawings.

FIG. 4 shows a procedure of one selection process included in a plurality of processes performed by using the high-voltage side terminal TH6. This process is performed by the drive controller 32. Note that the same step numbers as in FIG. 3 denote the same processes in FIG. 4.

If a negative determination is made in step S10, the process proceeds to step S18a. In step S18a, the drive controller 32 determines whether or not the discharging switching element 30 is in an on state, and the gate voltage Vge is lower than the threshold voltage Vth. The threshold voltage Vth is variably set depending on the temperature Tj of the switching element S*# detected by the temperature-sensitive diode SD. This considers that the threshold voltage Vth varies according to the temperature Tj.

Hence, by variably setting the threshold voltage Vth, which serves as a parameter for being compared with the gate voltage Vge in magnitude, depending on the temperature Tj, the timing at which the switching element S*# becomes an off state can be determined with high accuracy. Hence, the timing, at which the process for stabilizing the gate voltage Vge starts, can be more appropriate.

(Third Embodiment)

Hereinafter, the third embodiment will be described focusing on differences from the first embodiment with reference to drawings.

Figure 5:
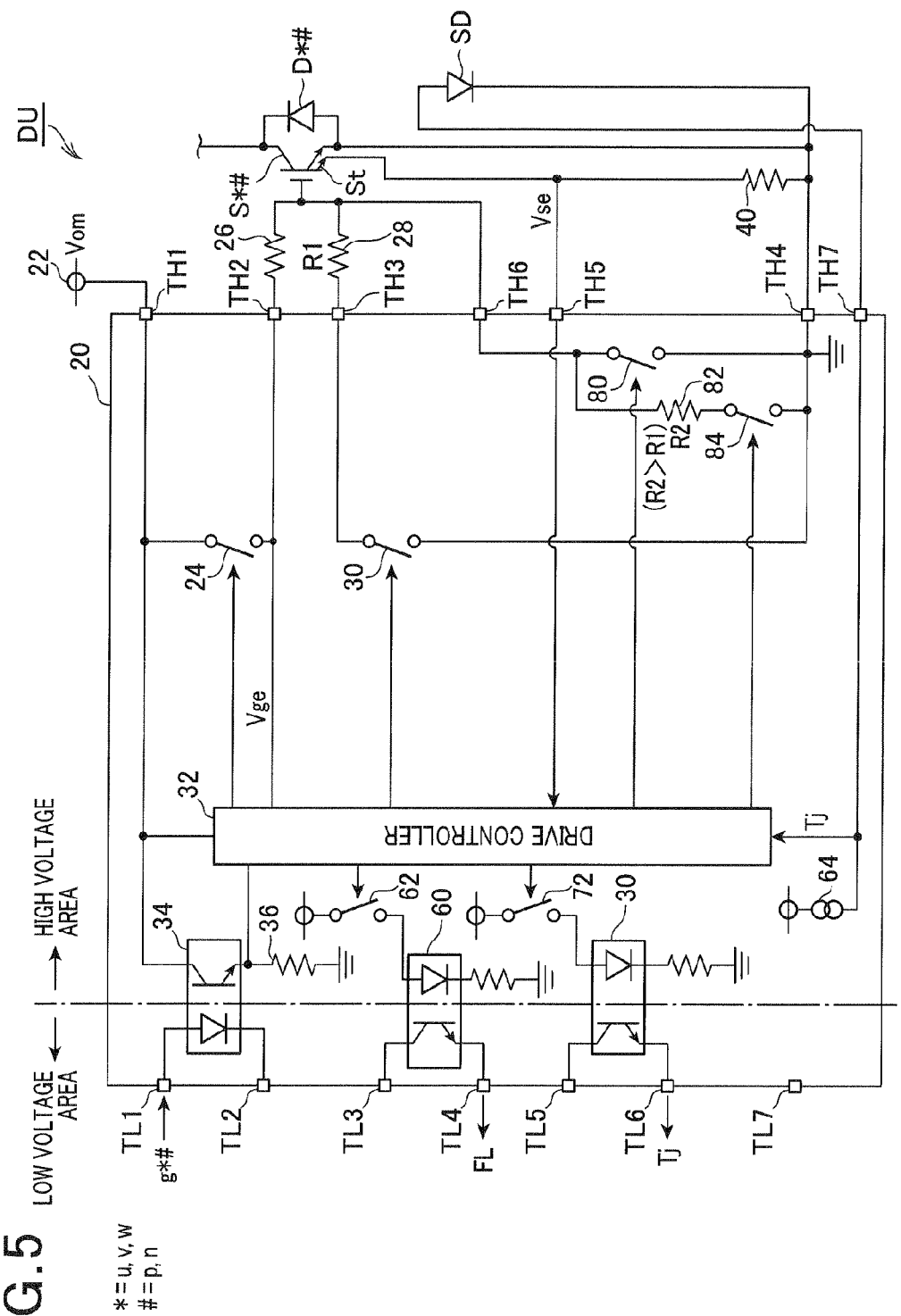
FIG. 5 is a circuit diagram showing a configuration of a drive unit according to a third embodiment.

FIG. 5 shows a configuration of a drive unit DU according to the present embodiment. Note that the same reference numerals as in FIG. 2 denote the same parts in FIG. 5.

As shown in FIG. 5, the high-voltage side terminal TH6 is connected to the high-voltage side terminal TH4 via a soft breaking resistor 82 and a soft breaking switching element 84. A resistance value R2 of the soft breaking resistor 82 is larger than a resistance value R1 of the discharging resistor 28. The soft breaking resistor 82 and the soft breaking switching element 84 forcibly turn off the switching element S*# by decreasing the potential difference between the gate and the emitter of the switching element S*#. The soft breaking resistor 82 and the soft breaking switching element 84 configure a potential difference limiting circuit.

In addition, the high-voltage side terminal TH6 is connected to the high-voltage side terminal TH4 via an off holding switching element 80. The off holding switching element 80 connects between the gate and emitter of the switching element S*# with low impedance when the switching element S*# is in an off state to stabilize the gate voltage Vge at a value for maintaining the off state. The off holding switching element 80 configures a stabilization circuit.

According to the present embodiment having the above configuration, the high-voltage side terminal TH6 is shared between the potential difference limiting circuit including the soft breaking switching element 84 and the stabilization circuit including the off holding switching element 80.

Figure 6:
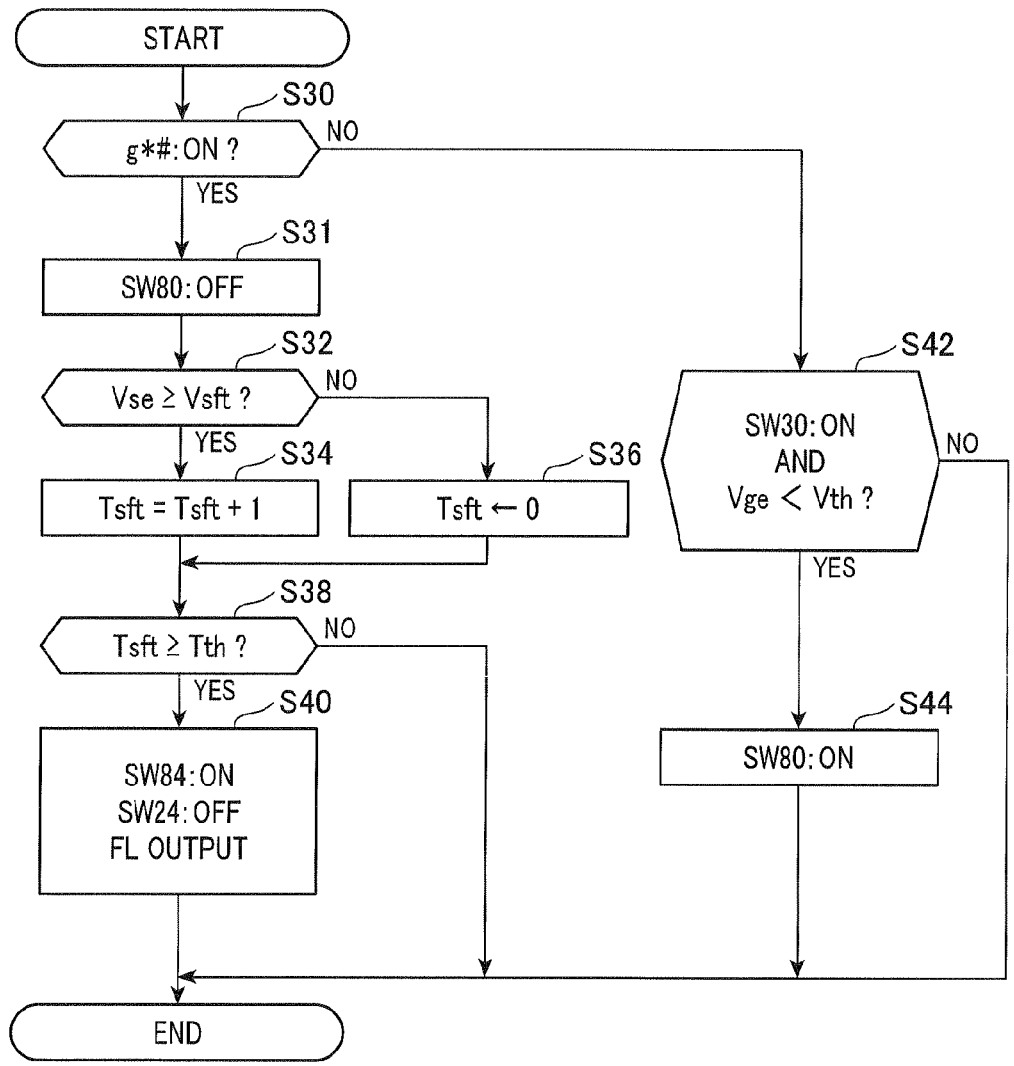
FIG. 6 is a flow diagram showing a procedure of a selection process according to the third embodiment.

FIG. 6 shows a procedure of one selection process included in a plurality of processes performed by using the high-voltage side terminal TH6. This process is performed by the drive controller 32.

First, in step S30, the drive controller 32 determines whether or not an operation signal g*# is an on-operation command. If it is determined that the operation signal g*# is an on-operation command, in step S31, the drive controller 32 turns off the off holding switching element 80. Then, the process proceeds to step S32. In step S32, the drive controller 32 determines whether or not the sense voltage Vse is equal to or more than a soft breaking threshold voltage Vsft. This process is performed for determining whether or not the current flowing through the switching element S*# is remarkably large. In step S32, if a positive determination is made, in step S34, the drive controller 32 increments a counter Tsft which measures the duration during which a positive determination is made in step S32. In contrast, if a negative determination is made in step S32, in step S36, the drive controller 32 initializes the counter Tsft.

If the processes of the steps S34 and S36 are completed, in step S38, the drive controller 32 determines whether or not the counter Tsft is equal to or more than a soft breaking threshold time Tth. This process is performed for determining whether or not the switching element S*# is forcibly turned off. The soft breaking threshold time Tth is set for preventing the erroneous determination that a remarkably large current has flowed to the switching element S*# due to noise or the like. If a positive determination is made in step S38, in step S40, the drive controller 32 turns off the charging switching element 24 and turns on the soft breaking switching element 84. In addition, the drive controller 32 outputs a fail signal FL. Hence, the switching element S*# is switched to an off state slower compared with a case where the discharging switching element 30 is used.

In contrast, if a negative determination is made in step S30, in step S42, the drive controller 32 turns on the discharging switching element 30 and determines whether or not the gate voltage Vge is lower than the threshold voltage Vth. If a positive determination is made in step S42, in step S44, the drive controller 32 turns on the off holding switching element 80.

If the process in step S40 or S44 is completed, or a negative determination is made in step S38 or S42, the whole process is ended.

According to the above embodiment, the following advantages can be obtained in addition to the advantages (1), (4) and (5) of the first embodiment.

(6) On the discharge path of the gate including the soft breaking switching element 84, a resistor (soft breaking resistor 82) is provided exclusively in the drive IC 20. Hence, although control of resistance of the resistor and the like becomes more difficult than those in a case where the resistor and the drive IC 20 are separated, the path between the gate of the switching element S*# and the high-voltage side terminal TH6 can be easily shared with the stabilization circuit.

Regarding the stabilization circuit:

The potential of the opening and closing control terminal (gate) is not limited to being fixed to the potential of the reference end (emitter) which is one end of the current path. For example, the potential of the opening and closing control terminal may be fixed to a potential lower than the emitter potential.

Regarding the guard process circuit:

The clamping switching element is not limited to that illustrated in FIG. 2. For example, a bipolar transistor may be used. In this case, the opening and closing control terminal (base) is electronically operated by controlling the amount of the current.

The guard process circuit is not limited to that controlling impedance of the current path of the clamping switching element. For example, the guard process circuit may include a series connection of a switching element and a Zener diode. To share the on-state terminal (high-voltage side terminal TH6) with the stabilization circuit, the stabilization circuit may include a switching element bypassing the Zener diode.

Regarding the potential difference limiting circuit:

Instead of the circuit illustrated in the third embodiment (FIG. 5), a controlling resistor may be provided between the high-voltage side terminal TH6 and the gate of the switching element S*#. If the resistance value of the controlling resistor is made smaller, the impedance of the path including the controlling resistor and the off holding switching element 80 may be appropriately lower to configure the stabilization circuit. In addition, controlling the impedance of the path including the soft breaking switching element 84 by controlling the resistance value of the controlling resistor, versatility of the path can be increased.

Regarding the soft breaking process and the guard process:

In the first embodiment (FIG. 3) and the second embodiment (FIG. 4), the power supply switching element 50 may be turned on to perform the guard process regardless of the collector current Ic during a specified time period and from the timing when the operation signal g*# is changed from an off-operation command to an on-operation command.

In the first embodiment (FIG. 2) and the second embodiment, the process for turning on the soft breaking switching element 44 may be the process illustrated in the third embodiment (FIG. 6).

In the third embodiment (FIG. 6), the soft breaking threshold time Tth may be shorter as the sense voltage Vse is higher. Alternatively, the guard process circuit illustrated in the first embodiment (FIG. 2) may be provided.

Regarding the absolute value control circuit:

The absolute value control circuit is not limited to the potential difference limiting circuit. For example, in the first embodiment (FIG. 2), the absolute value control circuit can be configured by providing the charging resistor 26 between the high-voltage side terminal TH1 and the high-voltage side terminal TH2. In this case, by connecting the stabilization circuit to the high-voltage side terminal TH2, the high-voltage side terminal TH2 can be shared with the stabilization circuit as the on-state terminal.

Regarding the selection circuit:

The condition for selecting the stabilization process is not limited to the fact that an AND operation becomes true when the discharging switching element 30 is turned on and when the gate voltage Vge is equal to or less than the threshold voltage Vth. For example, instead of turning on the discharging switching element 30, a condition that the operation signal g*# is an off-operation command may be used. In addition, the condition concerning the gate voltage Vge is not essential. For example, a condition may be used that a specified time period has passed from the timing when the operation signal g*# is changed to an off-operation command.

Regarding the integrated circuit:

The integrated circuit is not limited to the configuration including the high-voltage side area and the low-voltage side area which are insulated from each other. Even a configuration not including the high-voltage side area and the low-voltage side area is effective for the technique illustrated in the above embodiments to decrease the number of terminals of the integrated circuit.

Regarding the target switching element:

The target switching element is not limited to the IGBT. For example, the target switching element may be a metal-oxide semiconductor field-effect transistor (MOSFET). Not only an N-channel MOSFET but also a P-channel MOSFET may be used. Even in this case, the current path (between the source and the drain) can be opened and closed by controlling the potential difference between the opening and closing control terminal (gate) and the reference end (source) which is one end of the current path.

In addition, the target switching element is not limited to configuring a DC-AC conversion circuit (inverter INV). For example, the target switching element may configure a step down and up chopper circuit. If the target switching element configures a series connection of the switching element of an upper arm and the switching element of a lower arm, the process for limiting the gate voltage Vge to a value smaller than a steady-state value (terminal voltage Vom) at normal time can be easily limited to being performed when an on-operation command for the switching element is issued. Hence, a terminal is easily shared between the circuit performing a process for limitation and the stabilization circuit.

Hereinafter, aspects of the above-described embodiments will be summarized.

As an aspect of an embodiment, a drive circuit is provided for a switching element (S*#) which is a target to be driven and which opens and closes a current path by electronically controlling an absolute value of a potential difference between a reference end which is one end of the current path and an opening and closing control terminal. The drive circuit includes an integrated circuit (20) which is connected to the opening and closing control terminal. The integrated circuit includes an absolute value control circuit (46 to 52, 82, 84) which controls the absolute value of the potential difference when the switching element is in an off state; a stabilization circuit (46 to 52, 80) which stabilizes the potential difference at a value for maintaining the switching element in an off state when the switching element is in an off state; a selection circuit (32) which selects one of control of the absolute value of the potential difference by the absolute value control circuit and stabilization of the potential difference by the stabilization circuit; and an on-state terminal (TH6) which is connected to the absolute value control circuit and the opening and closing control terminal. The on-state terminal is connected to the stabilization circuit.

The absolute value control circuit is used when the switching element to be driven is in an on state. The stabilization circuit is used when the switching element to be driven is in an off state. Hence, both the absolute value control circuit and the stabilization circuit can be prevented from performing processes thereof at the same time. Considering this point, by connecting the on-state terminal connected to the absolute value control circuit to the stabilization circuit, the number of terminals of the integrated circuit can be decreased without interfering with functions of the absolute value control circuit and the stabilization circuit.

It will be appreciated that the present invention is not limited to the configurations described above, but any and all modifications, variations or equivalents, which may occur to those who are skilled in the art, should be considered to fall within the scope of the present invention.

What is claimed is:

1. A drive circuit for a switching element which is a target to be driven and which opens and closes a current path by electronically controlling an absolute value of a potential difference between a reference end which is one end of the current path and an opening and closing control terminal, the drive circuit comprising an integrated circuit which is connected to the opening and closing control terminal, wherein the integrated circuit includes:

an absolute value control circuit which controls the absolute value of the potential difference when the switching element is in an off state;

a stabilization circuit which stabilizes the potential difference at a value for maintaining the switching element in an off state when the switching element is in an off state;

a selection circuit which selects one of control of the absolute value of the potential difference by the absolute value control circuit and stabilization of the potential difference by the stabilization circuit; and an on-state terminal which is connected to the absolute value control circuit and the opening and closing control terminal, and the on-state terminal is connected to the stabilization circuit.

2. The drive circuit according to claim 1, wherein the absolute value control circuit is a potential difference limiting circuit which limits the absolute value of the potential difference by comparing the absolute value with a steady-state value at normal time when the switching element is in an on state and an abnormal state.

3. The drive circuit according to claim 2, wherein the potential difference limiting circuit is a guard process circuit which performs a guard process for the potential difference at a clamping voltage lower than the steady-state value at normal time.

4. The drive circuit according to claim 3, wherein the guard process circuit includes a clamping switching element which opens and closes a path between the reference end and the opening and closing control terminal, and an impedance control means which controls impedance of a current path of the clamping switching element by electronically operating the opening and closing control terminal of the clamping switching element.

5. The drive circuit according to claim 1, wherein the selection circuit selects the stabilization during at least part of a period of time during which an operation signal of the switching element serves as an off-operation command.

6. The drive circuit according to claim 5, wherein the selection circuit receives a detection value of the absolute value of the potential difference to select the stabilization.

7. The drive circuit according to claim 6, wherein the selection circuit receives a temperature of the switching element in addition to the detection value of the absolute value of the potential difference to select the stabilization.

8. The drive circuit according to claim 1, wherein the integrated circuit includes a high-voltage side area which is connected to the opening and closing control terminal of the switching element, and a low-voltage side area which is insulated from the high-voltage side area and receives an operation signal for the switching element.

* * * * *